(12) United States Patent
Lee et al.

(10) Patent No.: US 8,045,385 B2
(45) Date of Patent: Oct. 25, 2011

(54) METHODS OF OPERATING NONVOLATILE MEMORY DEVICES TO INHIBIT PARASITIC CHARGE ACCUMULATION THEREIN

(75) Inventors: Chang-Hyun Lee, Kyungki-do (KR); Jung-Dal Choi, Kyungki-do (KR); Young-Ho Lim, Kyungki-do (KR); Kang-Deog Suh, Kyungki-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/956,357

(22) Filed: Nov. 30, 2010

(65) Prior Publication Data

US 2011/0069543 A1 Mar. 24, 2011

Related U.S. Application Data

(63) Continuation of application No. 12/191,434, filed on Aug. 14, 2008, now Pat. No. 7,864,582.

(30) Foreign Application Priority Data

Nov. 21, 2007 (KR) ................. 2007-119348

(51) Int. Cl.
*G11C 16/04* (2006.01)
(52) U.S. Cl. .......... 365/185.17; 365/185.2; 365/185.26; 365/185.23; 365/185.29
(58) Field of Classification Search ............. 365/185.17, 365/185.2, 185.26, 185.23, 185.29
See application file for complete search history.

(56) References Cited

U.S. PATENT DOCUMENTS

| | | | |
|---|---|---|---|
| 5,473,563 A | 12/1995 | Suh et al. | |
| 6,858,899 B2 | 2/2005 | Mahajani et al. | |
| 6,881,626 B2 | 4/2005 | Lee et al. | |
| 6,958,936 B2 | 10/2005 | Quader et al. | |
| 6,995,424 B2 | 2/2006 | Lee | |
| 7,042,770 B2 | 5/2006 | Lee et al. | |
| 7,187,590 B2 | 3/2007 | Zous et al. | |
| 7,253,467 B2 | 8/2007 | Lee et al. | |
| 2003/0198101 A1 | 10/2003 | Pio | |
| 2004/0125629 A1 | 7/2004 | Scheuerlein et al. | |
| 2006/0180851 A1 | 8/2006 | Lee et al. | |
| 2007/0205445 A1 | 9/2007 | Park et al. | |
| 2008/0007999 A1 | 1/2008 | Park et al. | |
| 2008/0159009 A1 | 7/2008 | Aritome | |
| 2008/0165585 A1* | 7/2008 | Surico et al. ............. | 365/185.22 |
| 2008/0239822 A1 | 10/2008 | Kosaki et al. | |

FOREIGN PATENT DOCUMENTS

| | | |
|---|---|---|
| KR | 1020050077203 A | 8/2005 |
| KR | 1020060119988 A | 11/2006 |

* cited by examiner

*Primary Examiner* — Thong Q Le
(74) *Attorney, Agent, or Firm* — Myers Bigel Sibley & Sajovec, P.A.

(57) ABSTRACT

Methods of operating a charge trap nonvolatile memory device include operations to erase a first string of nonvolatile memory cells by selectively erasing even-numbered nonvolatile memory cells in the first string and then selectively erasing the odd-numbered nonvolatile memory cells in the first string, which may be interleaved with the even-numbered nonvolatile memory cells. This operation to selectively erase the even-numbered nonvolatile memory cells may include erasing the even-numbered nonvolatile memory cells while simultaneously biasing the odd-numbered nonvolatile memory cells in a blocking condition that inhibits erasure of the odd-numbered nonvolatile memory cells. The operation to selectively erase the odd-numbered nonvolatile memory cells may include erasing the odd-numbered nonvolatile memory cells while simultaneously biasing the even-numbered nonvolatile memory cells in a blocking condition that inhibits erasure of the even-numbered nonvolatile memory cells.

6 Claims, 18 Drawing Sheets

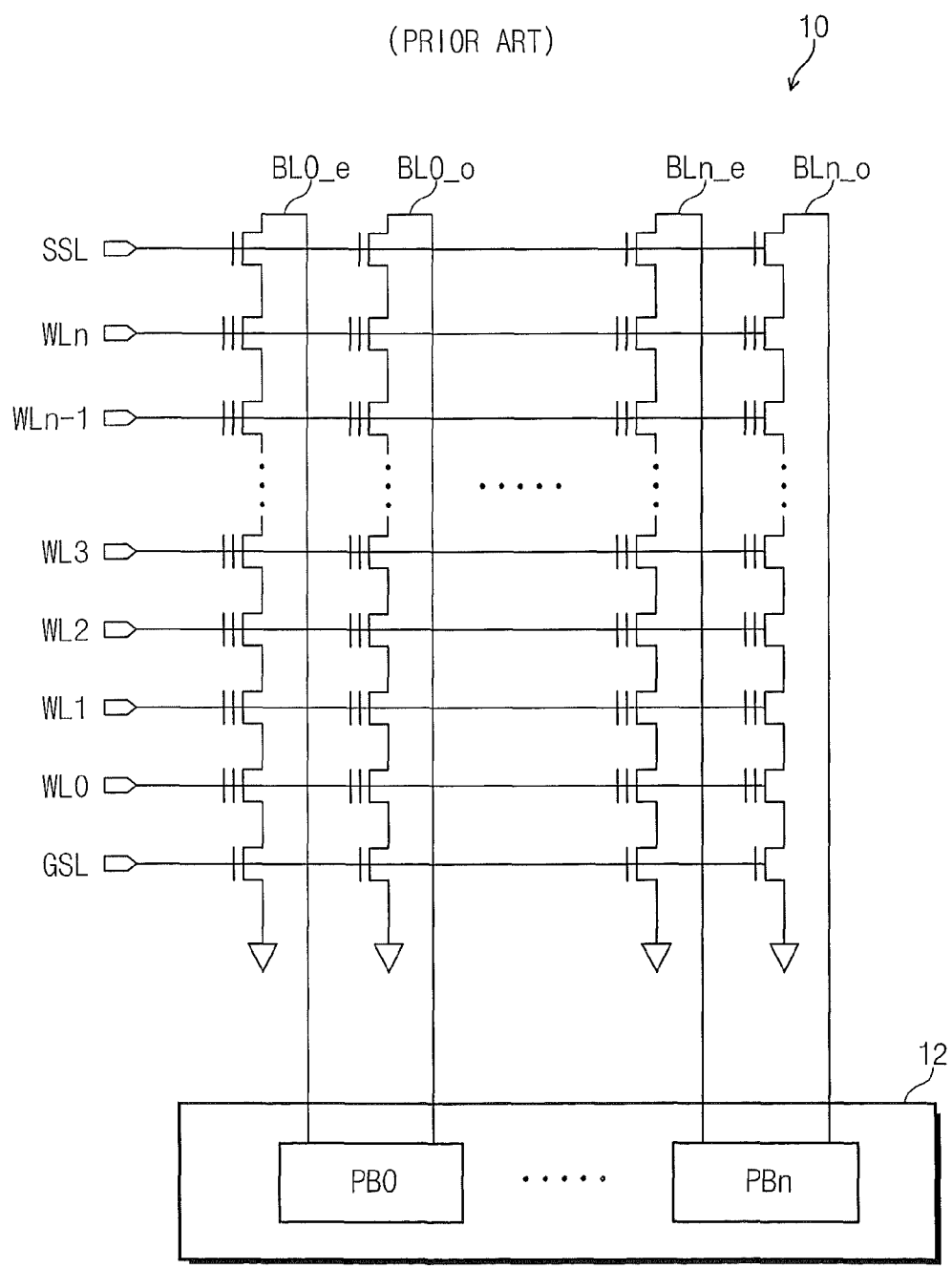

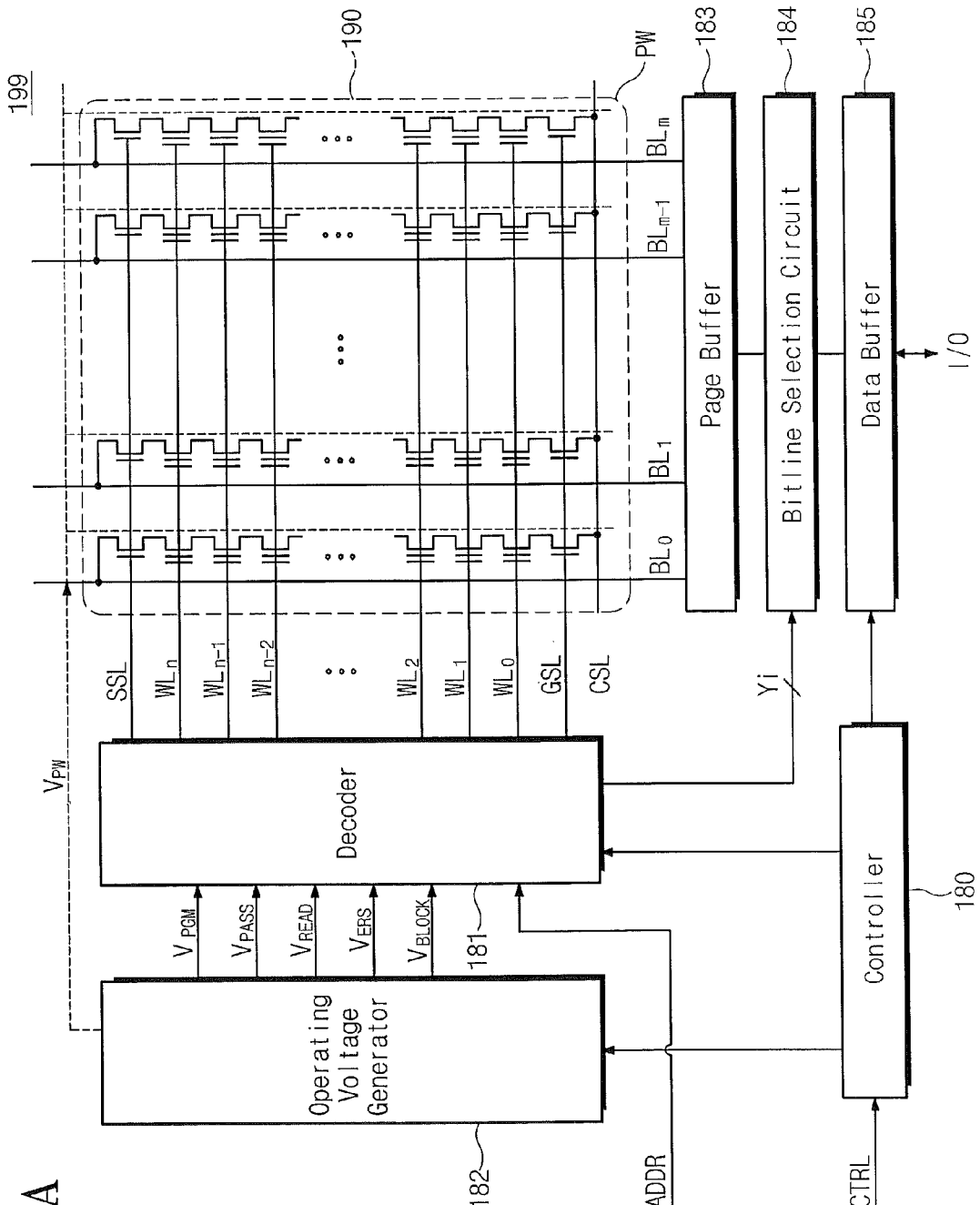

METHODS OF OPERATING NONVOLATILE MEMORY DEVICES TO INHIBIT PARASITIC CHARGE ACCUMULATION THEREIN

REFERENCE TO PRIORITY APPLICATIONS

This application is a continuation of U.S. application Ser. No. 12/191,434, filed Aug. 14, 2008 (now U.S. Pat. No. 7,864,582), which application claims priority to Korean Application No. 2007-119348, filed Nov. 21, 2007, the contents of which are hereby incorporated by reference.

FIELD OF THE INVENTION

The present invention relates to integrated circuit memory devices and, more particularly, to methods of operating nonvolatile memory devices.

BACKGROUND OF THE INVENTION

One class of nonvolatile memory devices includes electrically erasable programmable read only memory (EEPROM), which may be used in many applications including embedded applications and mass storage applications. In typical embedded applications, an EEPROM device may be used to provide code storage in personal computers or mobile phones, for example, where fast random access read times may be required. Typical mass storage applications include memory card applications requiring high capacity and low cost.

One category of EEPROM devices includes NAND-type flash memories, which can provide a low cost and high capacity alternative to other forms of nonvolatile memory. FIG. 1A illustrates a conventional flash memory array 10 having a plurality of NAND-type strings therein. Each of these NAND-type strings includes a plurality of EEPROM cells, which are associated with respective even and odd bit lines (BL0_e, BL0_o, ..., BLn_e, BLn_o). These bit lines are connected to a page buffer 12 having a plurality of buffer circuits (PB0, ..., PBn) therein. Each EEPROM cell includes a floating gate electrode (or charge trap layer) and a control gate electrode, which is electrically connected to a respective word line (WL0, WL1, ..., WLn). Access to each NAND string is enabled by driving a string select line (SSL) to a logic 1 voltage during reading and programming operations. Each NAND string also includes a respective ground select transistor, which is electrically connected to a ground select line (GSL).

As illustrated by FIG. 1B, the EEPROM cells within the flash memory array 10 of FIG. 1A may be cells that support a single programmed state. EEPROM cells that support only a single programmed state are typically referred to as single level cells (SLC). In particular, an SLC may support an erased state, which may be treated as a logic 1 storage value, and a programmed state, which may be treated as a logic 0 storage value. The SLC may have a negative threshold voltage (Vth) when erased (e.g., −3V<Vth<−1V) and a positive threshold voltage when programmed (e.g., 1V<Vth<3V). This programmed state may be achieved by setting the bit line BL to a logic 0 value (e.g., 0 Volts), applying a program voltage (Vpgm) to a selected EEPROM cell and applying a pass voltage (Vpass) to the unselected EEPROM cells within a string, as illustrated by FIG. 1C. In addition, during programming the NAND string may be enabled by applying a positive voltage (e.g., power supply voltage Vdd) to the string select line (SSL) and a ground voltage (e.g., 0 Volts) to the ground select line (GSL).

Moreover, the programmed state or erased state of an EEPROM cell may be detected by performing a read operation on a selected cell. As illustrated by FIG. 1D, a NAND string will operate to discharge a precharged bit line BL when a selected cell is in an erased state and the selected word line voltage (e.g., 0 Volts) is greater than the threshold voltage of the selected cell. However, when a selected cell is in a programmed state, the corresponding NAND string will provide an open circuit to the precharged bit line BL because the selected word line voltage (e.g., 0 Volts) is less than the threshold voltage of the selected cell and the selected cell remains "off". Other aspects of NAND-type flash memories are disclosed in an article by Jung et al., entitled "A 3.3 Volt Single Power Supply 16-Mb Nonvolatile Virtual DRAM Using a NAND Flash Memory Technology," IEEE Journal of Solid-State Circuits, Vol. 32, No. 11, pp. 1748-1757, November (1997), the disclosure of which is hereby incorporated herein by reference.

FIG. 2A is an electrical schematic of a conventional charge trap flash (CTF) memory array 10' having a plurality of NAND-type strings of charge trap memory cells therein that are electrically coupled to respective bit lines $BL_0$-$BL_m$. Each of the NAND-type strings in the array 10' includes a string selection transistor, a plurality of memory cell transistors and a ground selection transistor. The string selection transistors are responsive to a string selection signal provided on a string selection line SSL and the ground selection transistors are responsive to a ground selection signal provided on a ground selection line GSL. The source terminals of the ground selection transistors are connected to a common source line CSL, which may be biased at a ground reference potential (e.g., GND=Vss=0 Volts), and the drain terminals of the string selection transistors are connected to respective bit lines. Each row of memory cell transistors within the array 10' is electrically coupled to a corresponding word line (shown as $WL_0$-$W_n$).

FIG. 2B is a cross-sectional view of a NAND-type string of transistors within the array 10'. These transistors are formed within a semiconductor region 110, which may be a P-well region (PW) within a semiconductor substrate. This semiconductor region 110 forms rectifying junctions with the source/drain regions 140 of the transistors. A multilayer charge trap layer 120 is provided on a surface of the semiconductor region 110. This multilayer charge trap layer 120 includes a tunnel layer 122, a charge storage layer 124 and a blocking layer 126. The string selection lines, ground selection lines and word lines may be formed as metallization patterns 130 that extend on the multilayer charge trap layer 120, as illustrated. The string selection transistors and ground selection transistors within each NAND-type string may be configured as disclosed at FIGS. 2, 5-6 and 10 of U.S. Pat. No. 6,881,626 Lee et al., entitled "Method of Fabricating A Non-Volatile Memory Device With a String Select Gate," the disclosure of which is hereby incorporated herein by reference.

An interlayer insulating layer 145 is provided on the metallization patterns 130. This interlayer insulating layer 145 may be patterned to define bit line openings therein that expose corresponding drain regions 140 of the string selection transistors. These openings are filled with bit line plugs 150, which are electrically connected to corresponding bit lines BL. Similarly, the interlayer insulating layer 145, which may be a composite of multiple insulating layers, includes a common source line CSL that is electrically connected to corresponding source regions 140 of the ground selection transistors within the memory array 10'. These and other aspects of the CTF memory array 10' are also disclosed in U.S. Pat. No. 6,774,433 to Lee et al., the disclosure of which is hereby incorporated herein by reference. Charge trap flash (CTF) memory cells are also disclosed in U.S. Pat. No. 7,126,185 to Kang et al. and U.S. Pat. Publication No. 2006/0171209 to Sim et al.

SUMMARY OF THE INVENTION

Methods of operating nonvolatile memory devices according to embodiments of the present invention inhibit parasitic charge accumulation within charge trap layers by reducing fringing field strengths during flash erase operations. According to some of these embodiments, a method of operating a charge trap nonvolatile memory device includes operations to erase a first string of nonvolatile memory cells (e.g., NAND-type string of charge trap memory cells) by selectively erasing a first plurality of nonvolatile memory cells in the first string and then selectively erasing a second plurality of nonvolatile memory cells in the first string, which may be interleaved with the first plurality of nonvolatile memory cells. In particular, the sequential erase operations may include erasing the first plurality of nonvolatile memory cells while simultaneously biasing the second plurality of nonvolatile memory cells in a blocking condition that inhibits erasure of the second plurality of nonvolatile memory cells. This combination of operations is followed by erasing the second plurality of nonvolatile memory cells while simultaneously biasing the first plurality of nonvolatile memory cells in a blocking condition that inhibits erasure of the first plurality of nonvolatile memory cells.

According to further embodiments of the invention, the first string of nonvolatile memory cells is disposed in a semiconductor well region of first conductivity type (e.g., pocket p-well region) and erasing the first plurality of nonvolatile memory cells includes biasing the word lines associated with the first and second pluralities of nonvolatile memory cells at unequal voltages so that a voltage difference between the word lines associated with the first plurality of nonvolatile memory cells and the semiconductor well region is greater than a voltage difference between the word lines associated with the second plurality of nonvolatile memory cells and the semiconductor well region.

Still further embodiments of the invention include a nonvolatile memory device having an array of charge trap memory cells therein. This array of charge trap memory cells is electrically coupled to a plurality of functional word lines, which extend over corresponding channel regions of the charge trap memory cells in the array, and a plurality of dummy word lines, which respectively extend between corresponding pairs of functional word lines. In particular, the dummy word lines may extend opposite corresponding source/drain regions of the charge trap memory cells in the array. These embodiments may also include a word line driver configured to drive the plurality of functional word lines and the plurality of dummy word lines with erase voltages and blocking voltages, respectively, that are unequal, during an operation to erase the array of nonvolatile memory cells. In alternative embodiments of the invention, the plurality of dummy word lines may be configured to electrically "float" relative to the functional word lines.

Additional embodiments of the present invention include a method of erasing at least a first charge trap memory cell within a string by biasing a first word line associated with the first charge trap memory cell at a first voltage having a magnitude sufficient to establish or exceed a critical erase voltage between the first word line and a channel region of the first charge trap memory cell. This step of biasing the first word line is performed concurrently with biasing a second word line associated with a second charge trap memory cell extending immediately adjacent the first charge trap memory cell at a second voltage having a lower magnitude. This second voltage is insufficient to establish a critical erase voltage between the second word lines and a channel region of the second charge trap memory cell. Following these concurrent steps, an operation is performed to erase the second charge trap memory cell by biasing the second word line at the first voltage while concurrently biasing the first word line at the second voltage.

BRIEF DESCRIPTION OF THE DRAWINGS

FIG. 1A is an electrical schematic of a conventional nonvolatile memory device having NAND-type strings of EEPROM cells therein.

FIG. 6A is a block diagram of a memory device according to an embodiment of the present invention.

DETAILED DESCRIPTION OF PREFERRED EMBODIMENTS

Figure 1B:
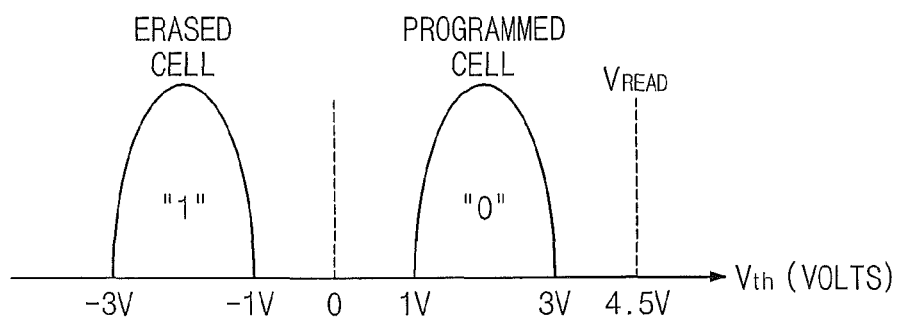
FIG. 1B is a graph illustrating the relative threshold voltages of an erased and programmed EEPROM cell, according to the prior art.
Figure 1C:
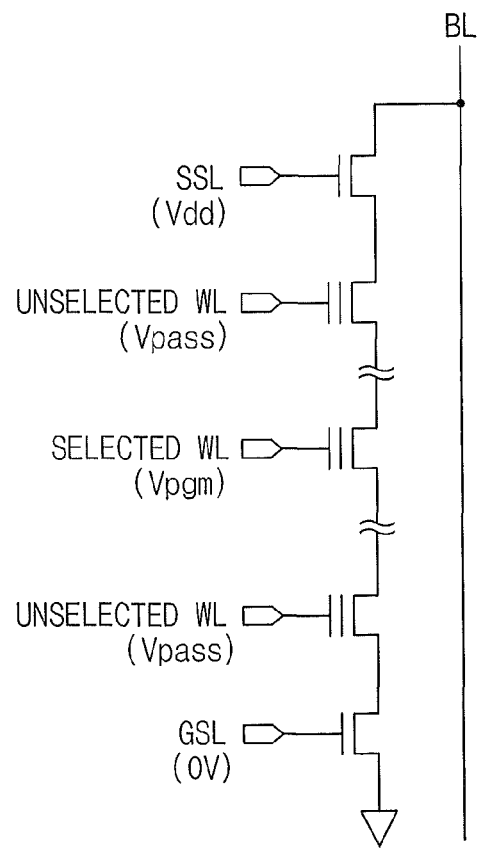
FIG. 1C is an electrical schematic of a NAND-type string of EEPROM cells showing programming bias conditions.
Figure 1D:
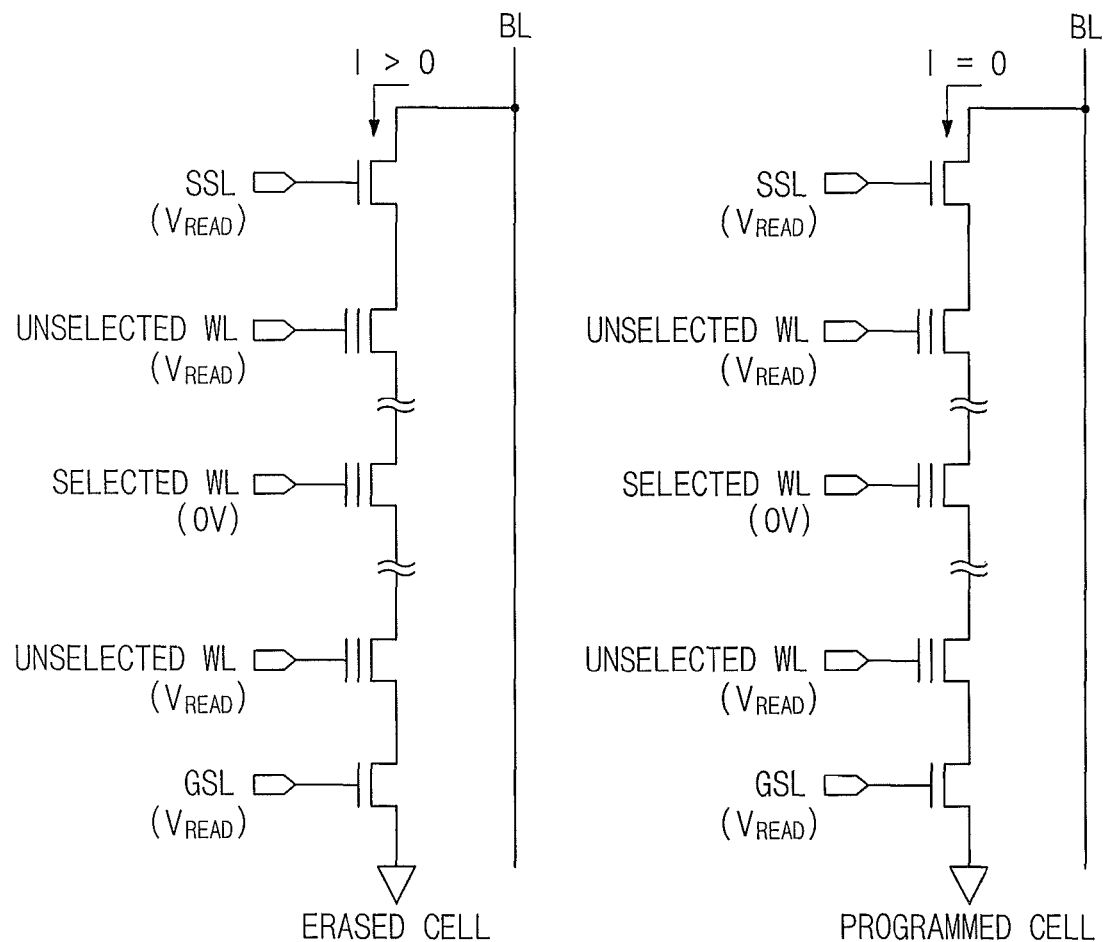
FIG. 1D illustrates current flow in a NAND-type string during operations to read data from an erased EEPROM cell and a programmed EEPROM cell according to the prior art.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements.

Figure 3A:
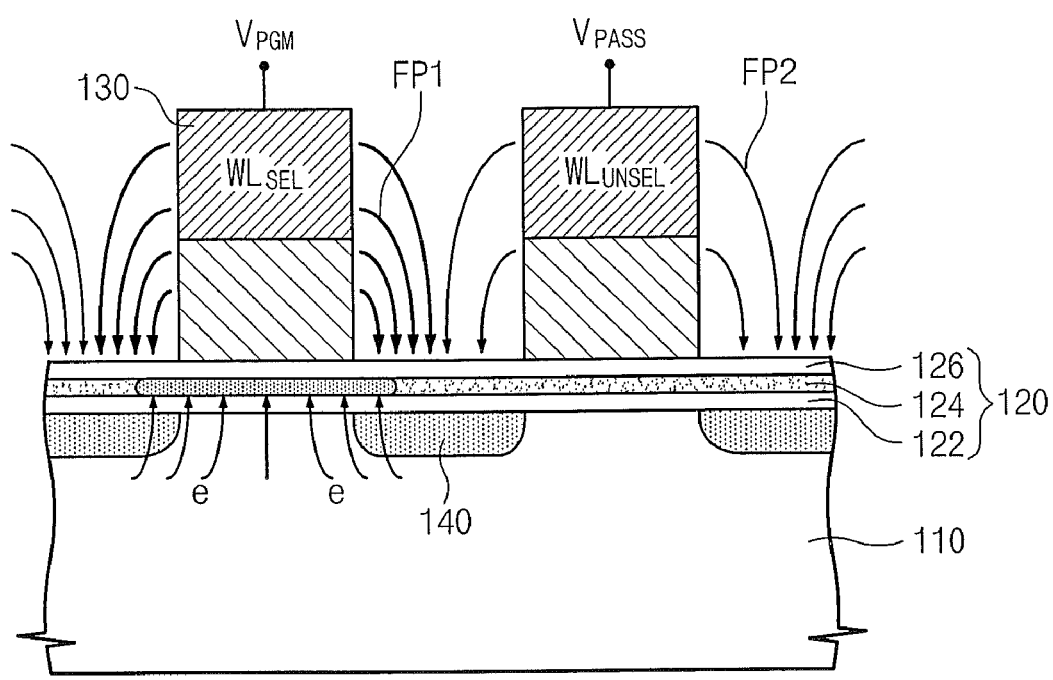
FIG. 3A is a cross-sectional view of a portion of a NAND-type string of charge trap memory cells that illustrates electron accumulation within a charge trap layer of a memory cell during an operation to program the memory cell.
Figure 3B:
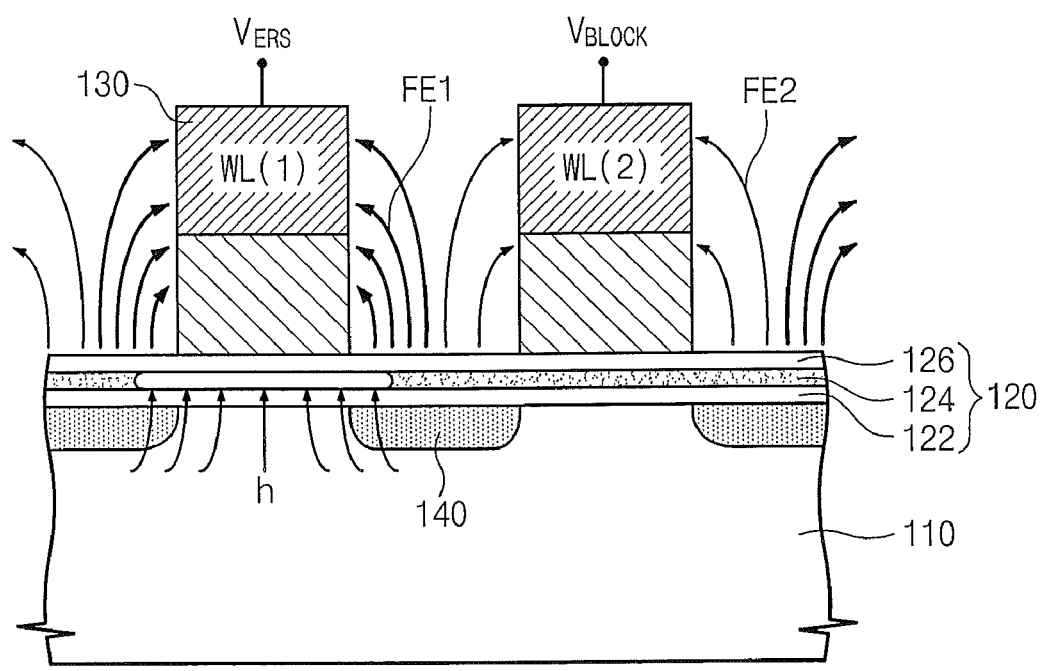
FIG. 3B is a cross-sectional view of a portion of a NAND-type string of charge trap memory cells that illustrates a first-half of an operation to erase the NAND-type string.
Figure 3C:
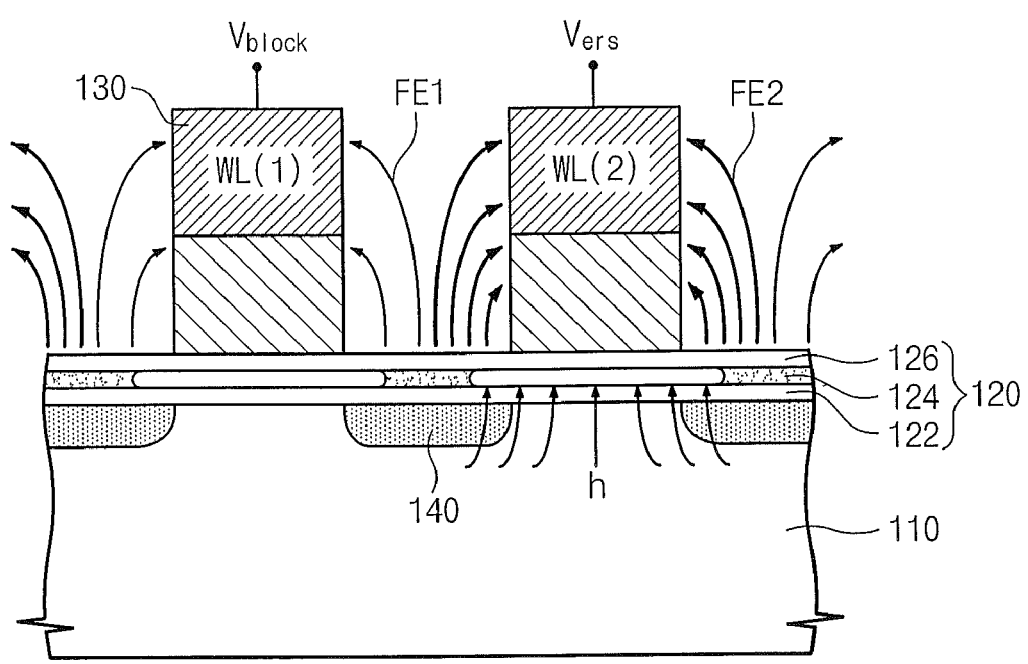
FIG. 3C is a cross-sectional view of a portion of a NAND-type string of charge trap memory cells that illustrates a second-half of an operation to erase the NAND-type string.

Referring now to FIGS. 3A-3C, first embodiments of the present include operations to erase a first NAND-type string of nonvolatile memory cells (e.g., CTF memory cells) by selectively erasing a first plurality of nonvolatile memory cells in the first string and then selectively erasing a second plurality of nonvolatile memory cells in the first string. The second plurality of nonvolatile memory cells may be interleaved with the first plurality of nonvolatile memory cells in an even-odd numbered sequence. As illustrated by FIGS. 3B-3C, the sequential erase operations may include erasing the first plurality of nonvolatile memory cells while simultaneously biasing the second plurality of nonvolatile memory cells in a blocking condition that inhibits erasure of the second plurality of nonvolatile memory cells. This combination of operations is followed by erasing the second plurality of nonvolatile memory cells while simultaneously biasing the first plurality of nonvolatile memory cells in a blocking condition that inhibits erasure of the first plurality of nonvolatile memory cells.

In particular, FIG. 3A illustrates electron accumulation within a charge storage layer 124 of a selected CTF memory cell during a conventional operation to program the selected CTF memory cell. As illustrated, electrons (e) are transferred from a channel region (e.g., P-well region 110) of the CTF memory cell to the corresponding charge storage layer 124 by biasing a word line 130 ($WL_{SEL}$) of the selected CTF memory cell with a sufficiently large program voltage ($V_{PGM}$) and biasing the P-well region 110 at a predetermined voltage (e.g., $V_{PW}$=0 Volts). Concurrently with these operations, the word lines 130 ($WL_{UNSEL}$) of the remaining unselected CTF memory cells within the NAND-type string are biased with a pass voltage ($V_{PASS}$). This pass voltage has a magnitude that is insufficient to cause significant transfer of electrons into the charge storage layers of unselected CTF memory cells. In particular, the biasing of the selected word line $WL_{SEL}$ with a program voltage $V_{PGM}$ results in the generation of relatively strong electric field lines FP1 within the multilayer charge trap layer 120. In contrast, the biasing of the remaining unselected word lines $WL_{UNSEL}$ with respective pass voltages $V_{PASS}$ results in the generation of relatively weak electric field lines FP2 within the multilayer charge trap layer 120. Under these conditions: $(V_{PGM}-V_{PW})>(V_{PASS}-V_{PW})$ and FP1>FP2.

Referring now to FIG. 3B, the bias conditions associated with a first-half of a two-step erase operation according to an embodiment of the present invention will be described. In particular, FIG. 3B illustrates hole accumulation within the charge storage layers 124 of one-half of the CTF memory cells in a NAND-type string. As illustrated, holes (h) are transferred from channel regions (e.g., P-well regions 110) of odd numbered CTF memory cells to the corresponding charge storage layer 124 by biasing the "odd numbered" word lines 130 ($WL_1$) of the selected CTF memory cells with an erase voltage ($V_{ERS}$) and biasing the P-well region 110 at a predetermined voltage. The magnitude of the erase voltage ($V_{ERS}$) is sufficient to establish or exceed a critical erase voltage that corresponds to a level sufficient to erase a corresponding CTF memory cell. In contrast, significant hole accumulation within the charge storage layers 124 of even numbered CTF memory cells in a NAND-type string is precluded by biasing the "even numbered" word lines 130 ($WL_2$) of the unselected CTF memory cells with a blocking voltage ($V_{BLOCK}$). Based on these bias conditions, the electric field lines FE1 associated with the odd numbered word lines will be significantly stronger than the electric field lines FE2 associated with the even numbered word lines and the odd numbered CTF memory cells will become erased.

Subsequently, as illustrated by FIG. 3C, hole accumulation within the charge storage layers 124 of the second-half of the CTF memory cells in the NAND-type string can be provided to complete a multi-step (e.g., two-step) erase operation. In particular, holes (h) are transferred from channel regions (e.g., P-well regions 110) of even numbered CTF memory cells to the corresponding charge storage layer 124 by biasing the "even numbered" word lines 130 ($WL_2$) of the selected CTF memory cells with an erase voltage ($V_{ERS}$) and biasing the P-well region 110 at a predetermined voltage. Significant hole accumulation within the charge storage layers 124 of the odd numbered CTF memory cells is precluded by biasing the "odd numbered" word lines 130 ($WL_2$) with the blocking voltage ($V_{BLOCK}$). Based on these bias conditions, the electric field lines FE2 associated with the even numbered word lines will be stronger than the electric field lines FE1 associated with the odd numbered word lines and the even numbered CTF memory cells will become erased.

Although not wishing to be bound by any theory, it is believed that the asymmetries in the strengths of the field lines FE1 and FE2 during the first and second halves of the multi-step erase operation inhibit excessive hole transfer into the charge storage layers 124 of the CTF memory cells and thereby inhibit an over-erase condition that might otherwise occur after many repeated program/erase cycles have been performed on the NAND-type string of CTF memory cells. In particular, it is believed that the excessive hole transfer may otherwise occur when a combined electric field resulting from an overlap in the field lines FE1 and FE2 becomes excessive. Accordingly, to limit the magnitude of the combined electric field, a two-step erase operation is performed so that any combined electric field resulting from the overlap in the electric field lines FE1 and FE2 is kept at level that is insufficient to cause an over-erase condition during the normal operating life of the NAND-type string.

Figure 4A:
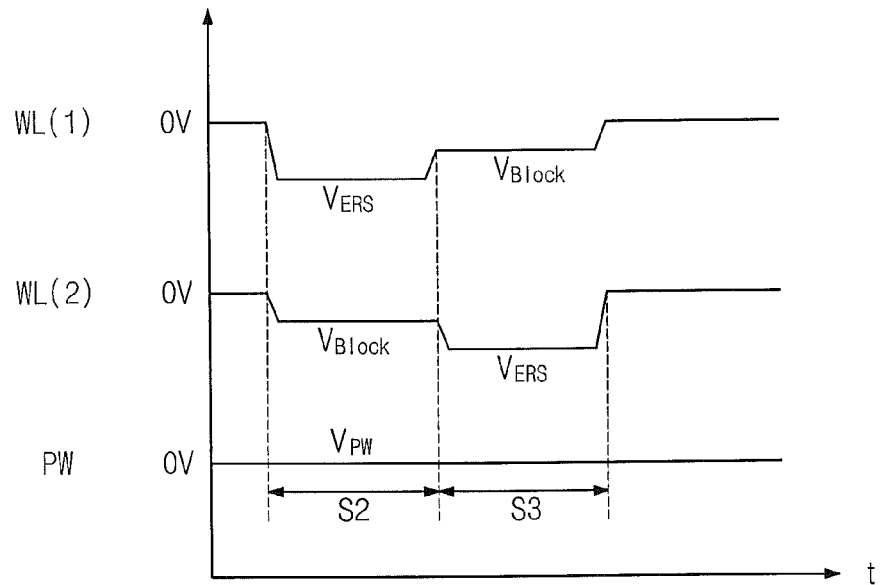
FIGS. 4A-4F are timing diagrams that illustrate word line and P-well biasing conditions during an operation to erase a NAND-type string of CTF memory cells.

FIGS. 4A-4F are timing diagrams that illustrate word line and P-well biasing conditions during an operation to erase a NAND-type string of CTF memory cells, as described above with respect to FIGS. 3B-3C. In particular, FIG. 4A illustrates that during time interval S2, which represents a time interval associated with a first-half of a two-step erase operation, the erase voltage ($V_{ERS}$) on the odd numbered word lines is sufficiently negative relative to the p-well voltage ($V_{PW}$) to cause erasure of the odd numbered CTF memory cells within a NAND-type string, but the blocking voltage ($V_{BLOCK}$) on the even numbered word lines is insufficiently negative to cause erasure of the even numbered CTF memory cells. Accordingly, during the time interval S2, $|V_{ERS}-V_{PW}|>|V_{BLOCK}-V_{PW}|$. Thereafter, during time interval S3, the voltages on the even and odd numbered word lines WL(1) and WL(2) are reversed to thereby cause erasure of the even numbered CTF memory cells within the NAND-type string.

Figure 4B:
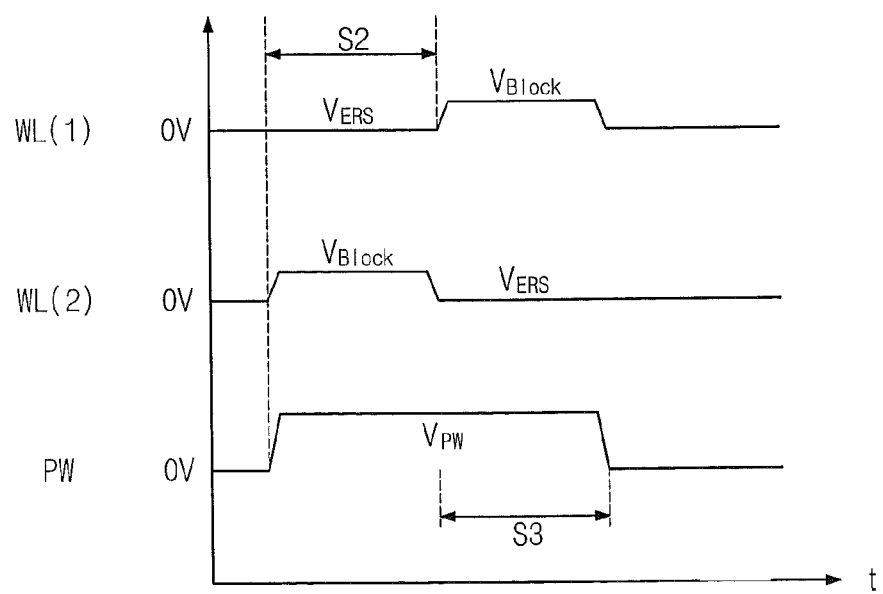

FIG. 4B illustrates alternative biasing conditions relative to FIG. 4A to achieve complete erasure of a NAND-type string of CTF cells during a two-step erase operation. During time interval S2, the erase voltage $V_{ERS}$ is held at 0 Volts and the p-well voltage $V_{PW}$ is switched to a positive voltage to thereby cause erasure of the odd numbered CTF memory cells. The blocking voltage $V_{BLOCK}$ is also switched to a positive voltage level to inhibit erasure of the even numbered CTF memory cells. Accordingly, during time interval S2, $|V_{ERS}-V_{PW}|>|V_{BLOCK}-V_{PW}|$. Thereafter, during time interval S3, the voltages on the even and odd numbered word lines WL(1) and WL(2) are reversed to thereby cause erasure of the even numbered CTF memory cells within the NAND-type string.

Figure 4C:
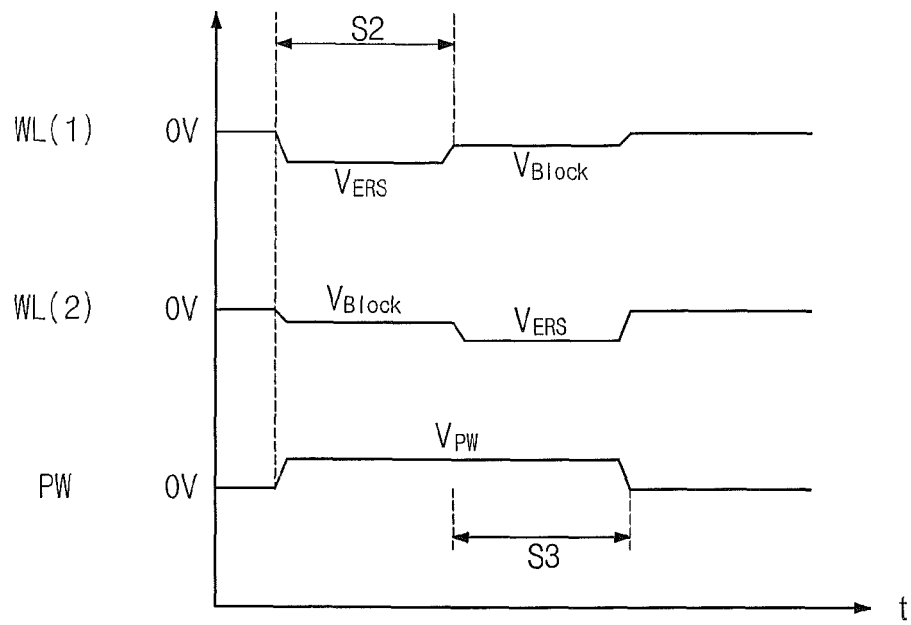

FIG. 4C illustrates alternative biasing conditions relative to FIGS. 4A-4B to achieve complete erasure of a NAND-type string of CTF cells during a two-step erase operation. During time interval S2, the erase voltage $V_{ERS}$ is switched to a negative voltage level and the p-well voltage $V_{PW}$ is switched to a positive voltage to thereby cause erasure of the odd numbered CTF memory cells. The blocking voltage $V_{BLOCK}$ is also switched to a slightly negative voltage level to inhibit erasure of the even numbered CTF memory cells. Accordingly, during time interval S2, $|V_{ERS}-V_{PW}|>|V_{BLOCK}-V_{PW}|$. Thereafter, during time interval S3, the voltages on the even and odd numbered word lines WL(1) and WL(2) are reversed to thereby cause erasure of the even numbered CTF memory cells within the NAND-type string.

Figure 4D:
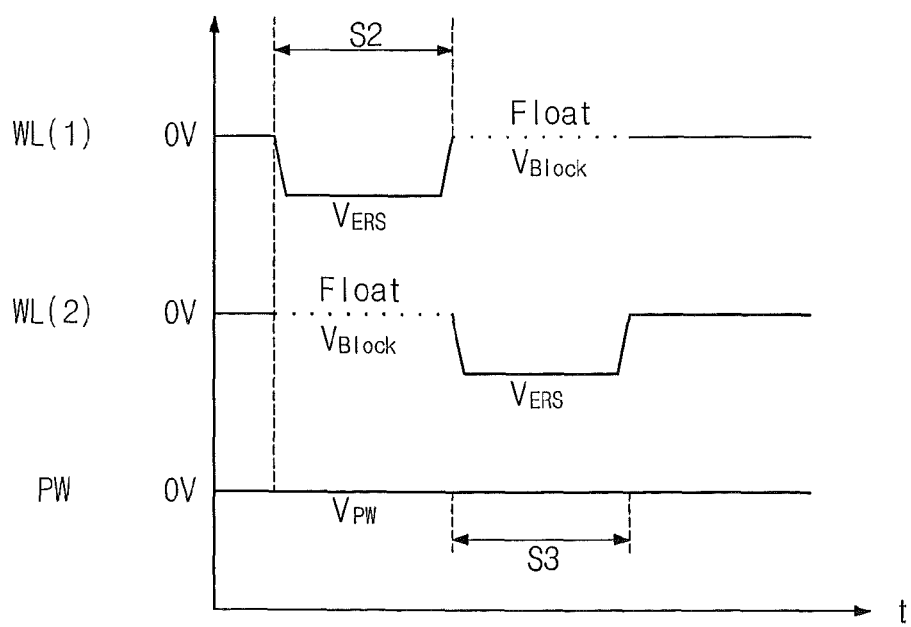

FIG. 4D illustrates alternative biasing conditions relative to FIGS. 4A-4C to achieve complete erasure of a NAND-type string of CTF cells during a two-step erase operation. During time interval S2, the erase voltage $V_{ERS}$ is switched to a negative voltage level and the p-well voltage $V_{PW}$ is held at 0 Volts. The blocking voltage $V_{BLOCK}$ is also maintained at a floating level (Float) at about 0 Volts to inhibit erasure of the even numbered CTF memory cells. Accordingly, during time interval S2, $|V_{ERS}-V_{PW}|>|V_{BLOCK}-V_{PW}|$, where the actual "floating" voltages on the even numbered word lines may be pulled slightly negative because of capacitive coupling with the odd numbered word lines. Thereafter, during time interval S3, the voltages on the even and odd numbered word lines WL(1) and WL(2) are reversed to thereby cause erasure of the even numbered CTF memory cells within the NAND-type string.

Figure 4E:
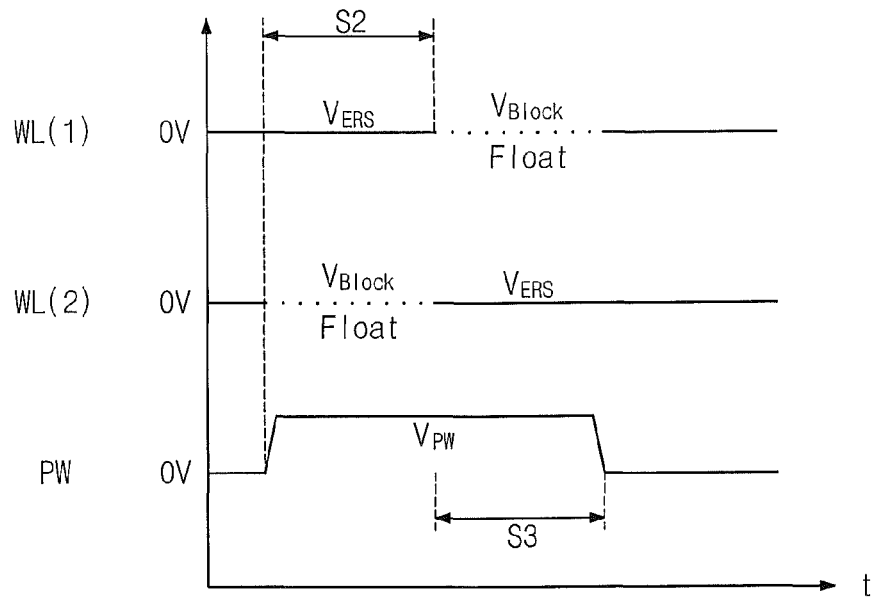

FIG. 4E illustrates alternative biasing conditions relative to FIGS. 4A-4D to achieve complete erasure of a NAND-type string of CTF cells during a two-step erase operation. During time interval S2, the erase voltage $V_{ERS}$ is held at 0 Volts and the p-well voltage $V_{PW}$ is switched to a positive voltage. The blocking voltage $V_{BLOCK}$ is also maintained at a floating level (Float) at about 0 Volts to inhibit erasure of the even numbered CTF memory cells. Accordingly, during time interval S2, $|V_{ERS}-V_{PW}|>|V_{BLOCK}-V_{PW}|$, where the actual "floating" voltages on the even numbered word lines may be pulled slightly positive because of capacitive coupling with the p-well region. Thereafter, during time interval S3, the voltages on the even and odd numbered word lines WL(1) and WL(2) are reversed to thereby cause erasure of the even numbered CTF memory cells within the NAND-type string.

Figure 4F:
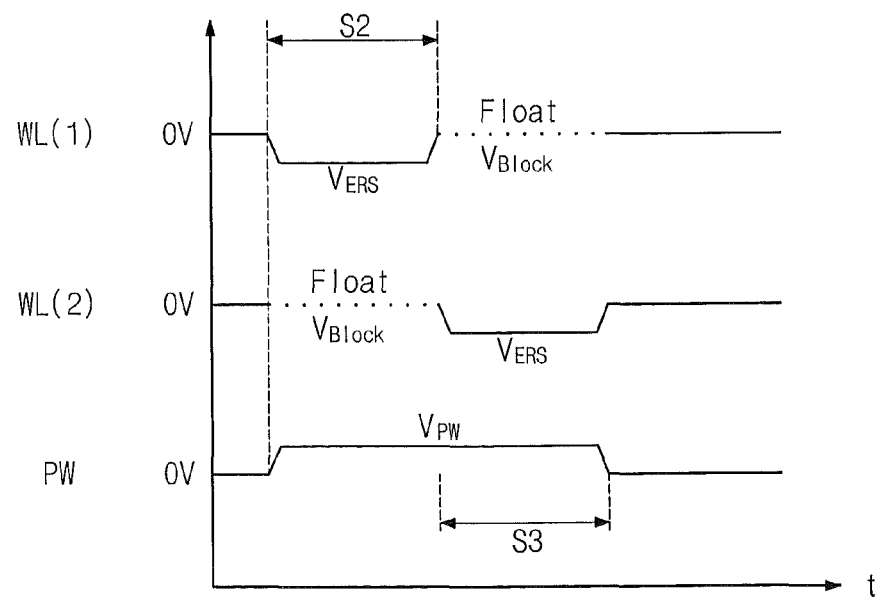

FIG. 4F illustrates alternative biasing conditions relative to FIGS. 4A-4E to achieve complete erasure of a NAND-type string of CTF cells during a two-step erase operation. During time interval S2, the erase voltage $V_{ERS}$ is switched to a negative voltage and the p-well voltage $V_{PW}$ is switched to a positive voltage. The blocking voltage $V_{BLOCK}$ is also maintained at a floating level (Float) at about 0 Volts to inhibit erasure of the even numbered CTF memory cells. Accordingly, during time interval S2, $|V_{ERS}-V_{PW}|>|V_{BLOCK}-V_{PW}|$, where the actual "floating" voltages on the even numbered word lines may be pulled slightly positive or slightly negative because of capacitive coupling with the p-well region and the odd numbered word lines. Thereafter, during time interval S3, the voltages on the even and odd numbered word lines WL(1) and WL(2) are reversed to thereby cause erasure of the even numbered CTF memory cells within the NAND-type string.

Figure 2A:
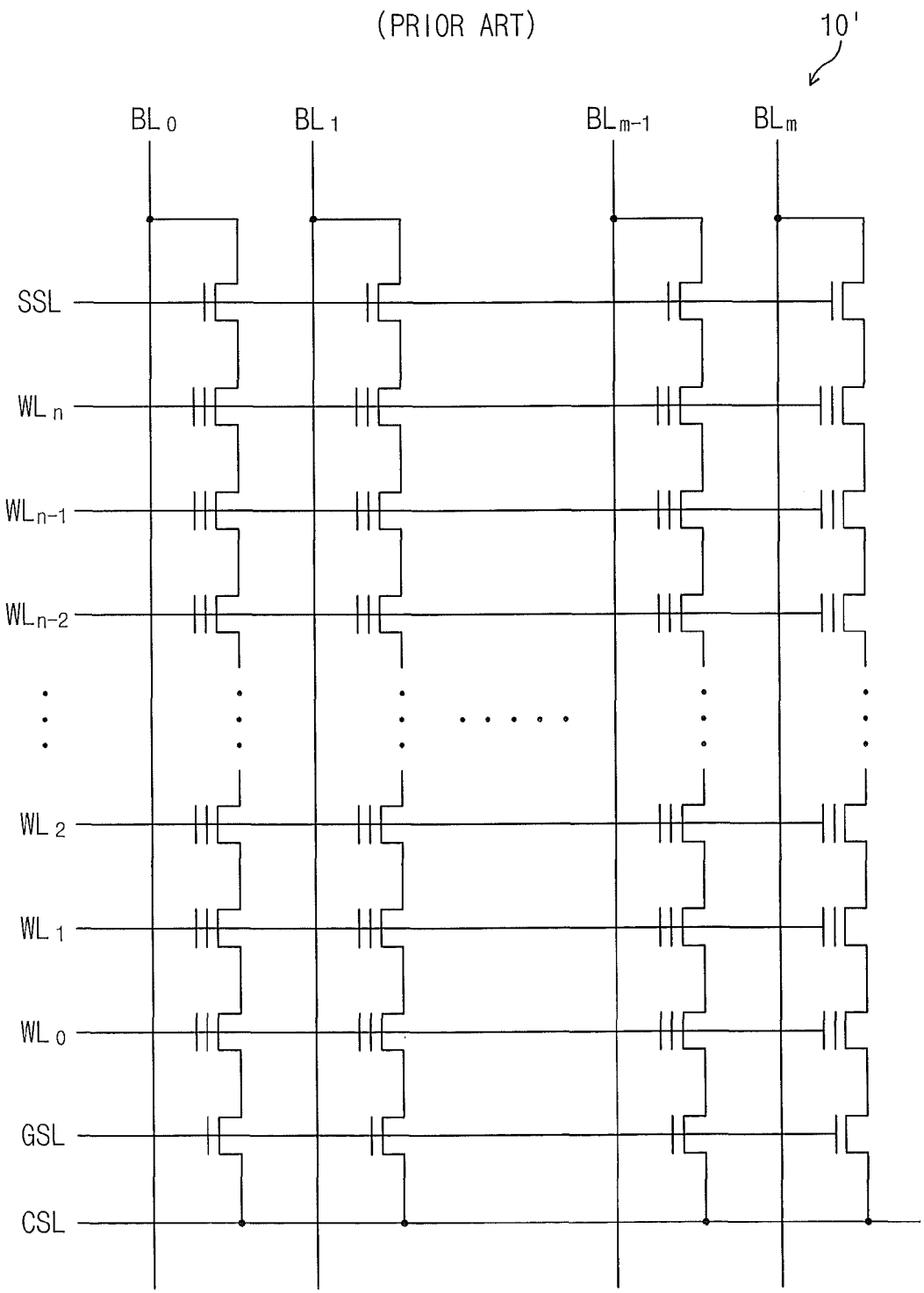
FIG. 2A is an electrical schematic of a conventional memory array having a plurality of NAND-type strings of charge trap memory cells therein.
Figure 2B:
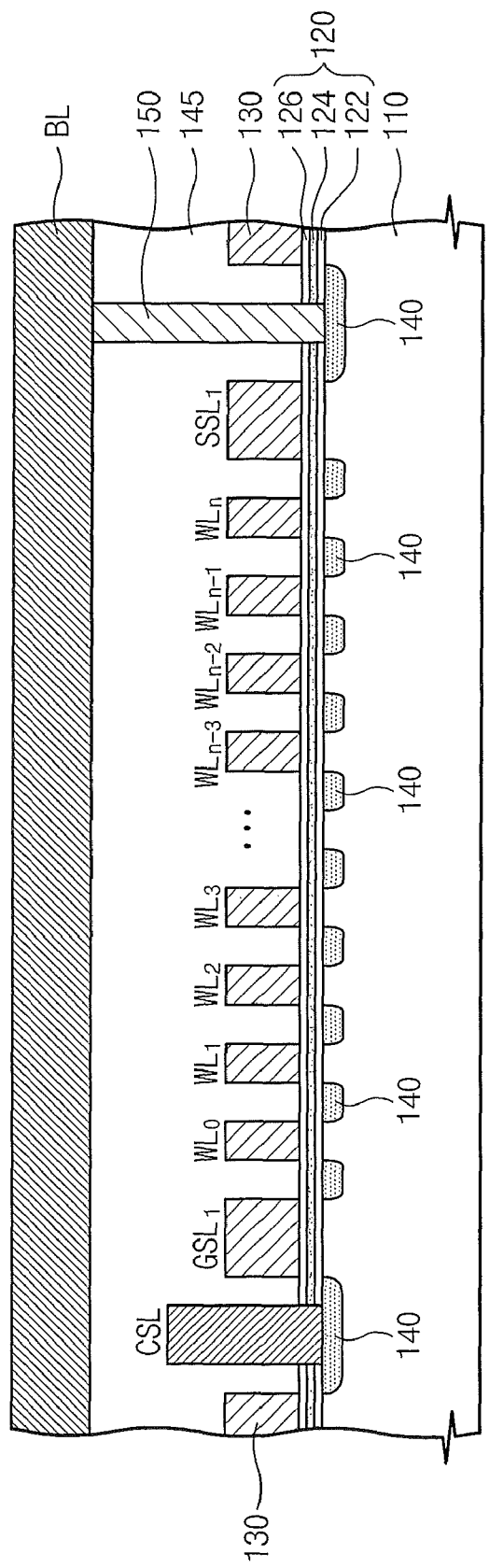
FIG. 2B is a cross-sectional view of a NAND-type string of charge trap memory cells illustrated by FIG. 2A.
Figure 5A:
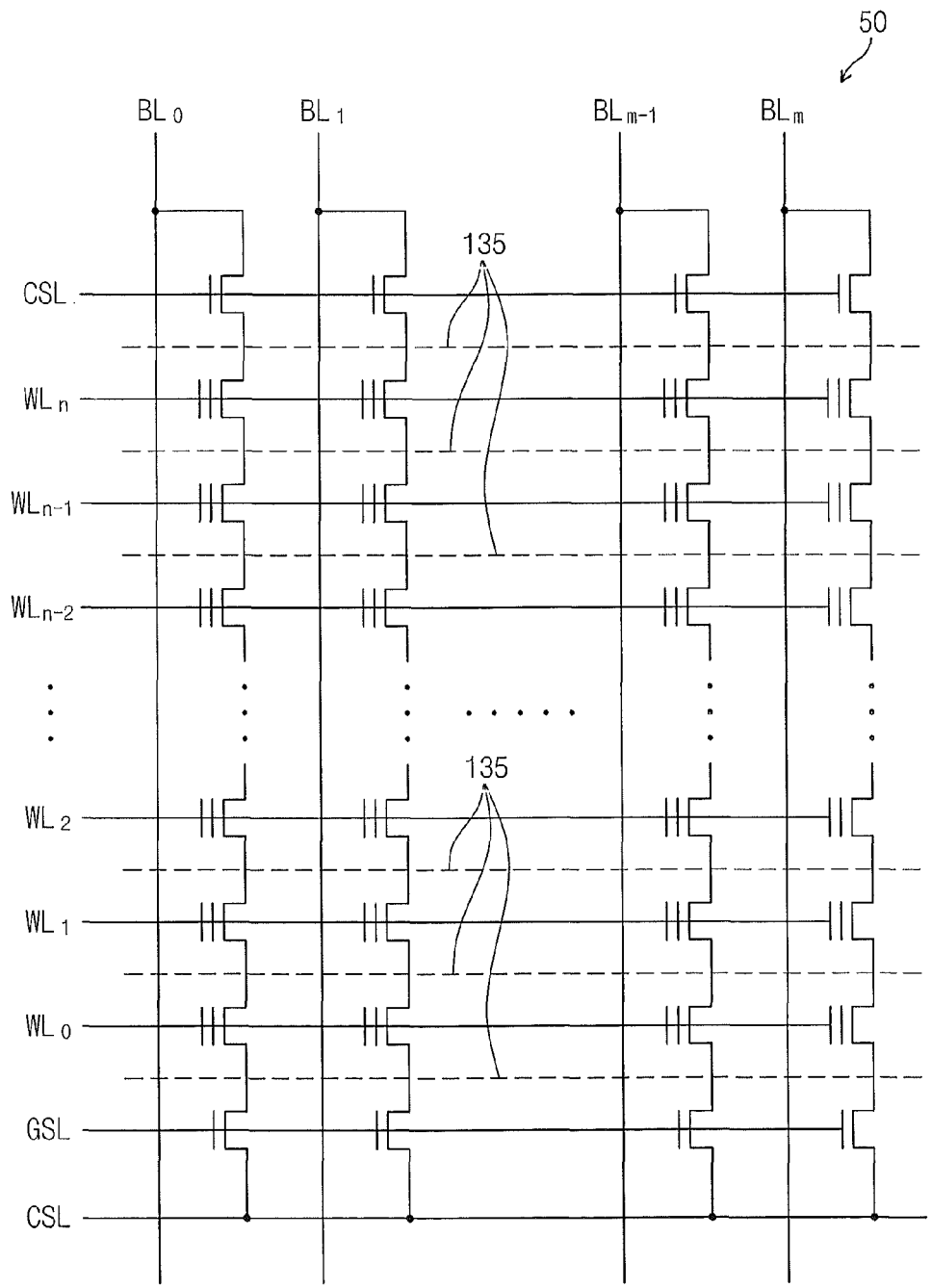
FIG. 5A is an electrical schematic of a memory array having a plurality of NAND-type strings of charge trap flash (CTF) memory cells therein, according to an embodiment of the present invention.
Figure 5B:
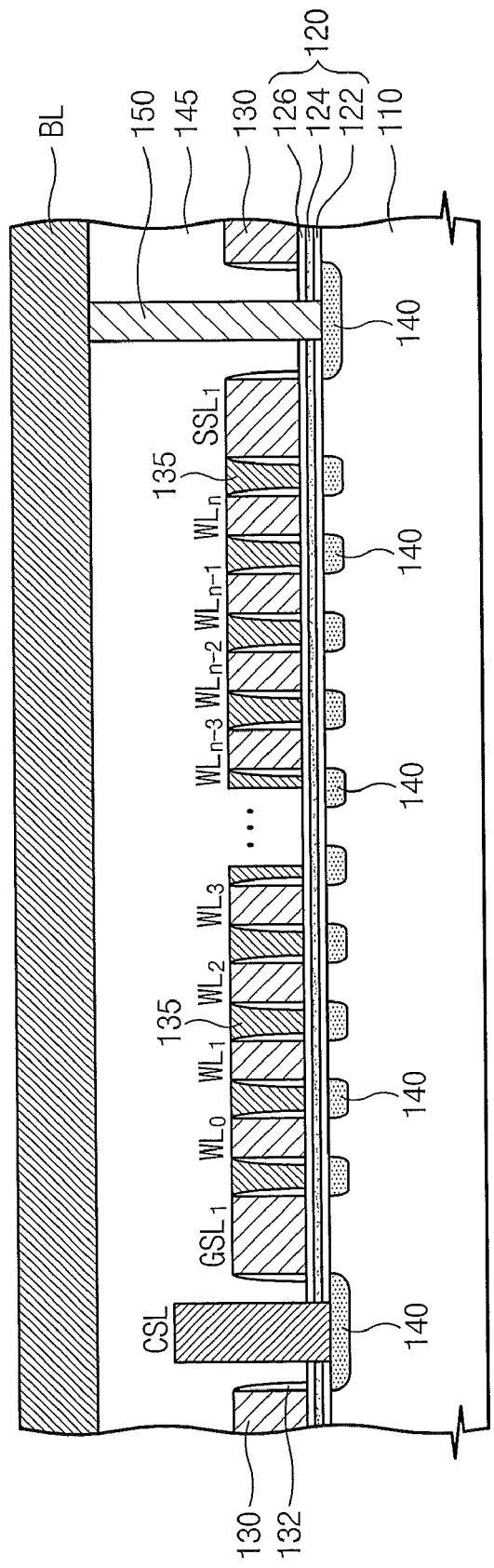
FIG. 5B is a cross-sectional view of a NAND-type string of CTF memory cells illustrated by FIG. 5A.

FIGS. 5A-5B illustrate a CTF memory array 50 according to an additional embodiment of the present invention. As illustrated by FIG. 5A, the memory array 50 is similar to the array 10' of FIG. 2A, but includes additional dummy word lines 135 that are each positioned between a corresponding pair of functional word lines ($WL_0$-$W_n$). As illustrated by FIG. 5B, each dummy word line 135 is positioned between a corresponding pair of functional word lines WL and opposite a corresponding source/drain region 140 of a CTF transistor within the illustrated NAND-type string. Although not wishing to be bound by any theory, each dummy word line 135 operates to inhibit excessive hole accumulation within the multilayer charge trap layer 120 during an operation to erase the CTF transistors within the corresponding NAND-type string, by reducing the strength of any overlapping electric fields in the regions between adjacent functional word lines. This prevention of excessive hole accumulation may be enhanced by driving the dummy word lines 135 at a predetermined voltage or by electrically "floating" the dummy word lines 135 during each operation to erase the memory array 50. The predetermined voltage may have the same magnitude as the blocking voltage $V_{BLOCK}$.

Figure 6B:
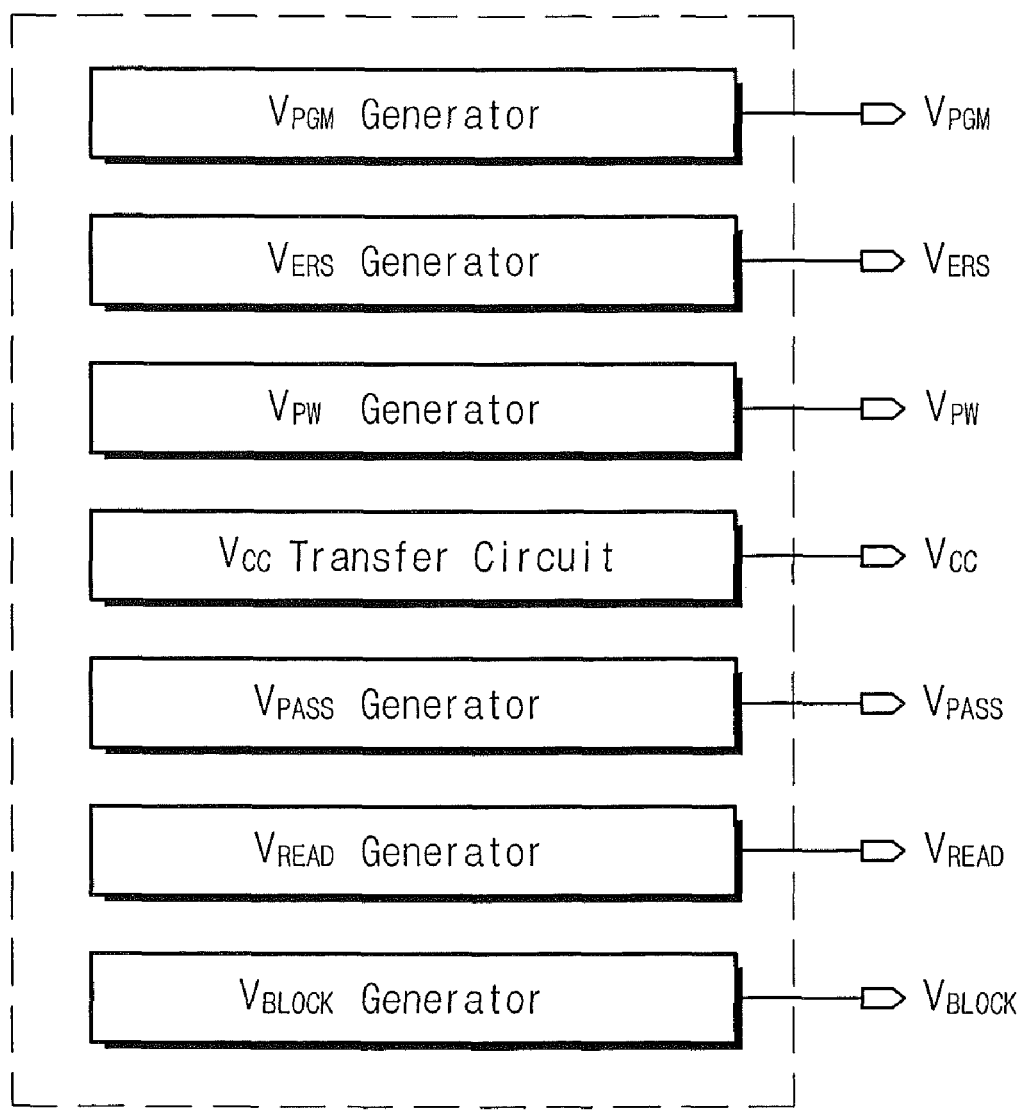
FIG. 6B is a block diagram that illustrates an embodiment of the voltage generator of FIG. 6A.
Figure 6C:
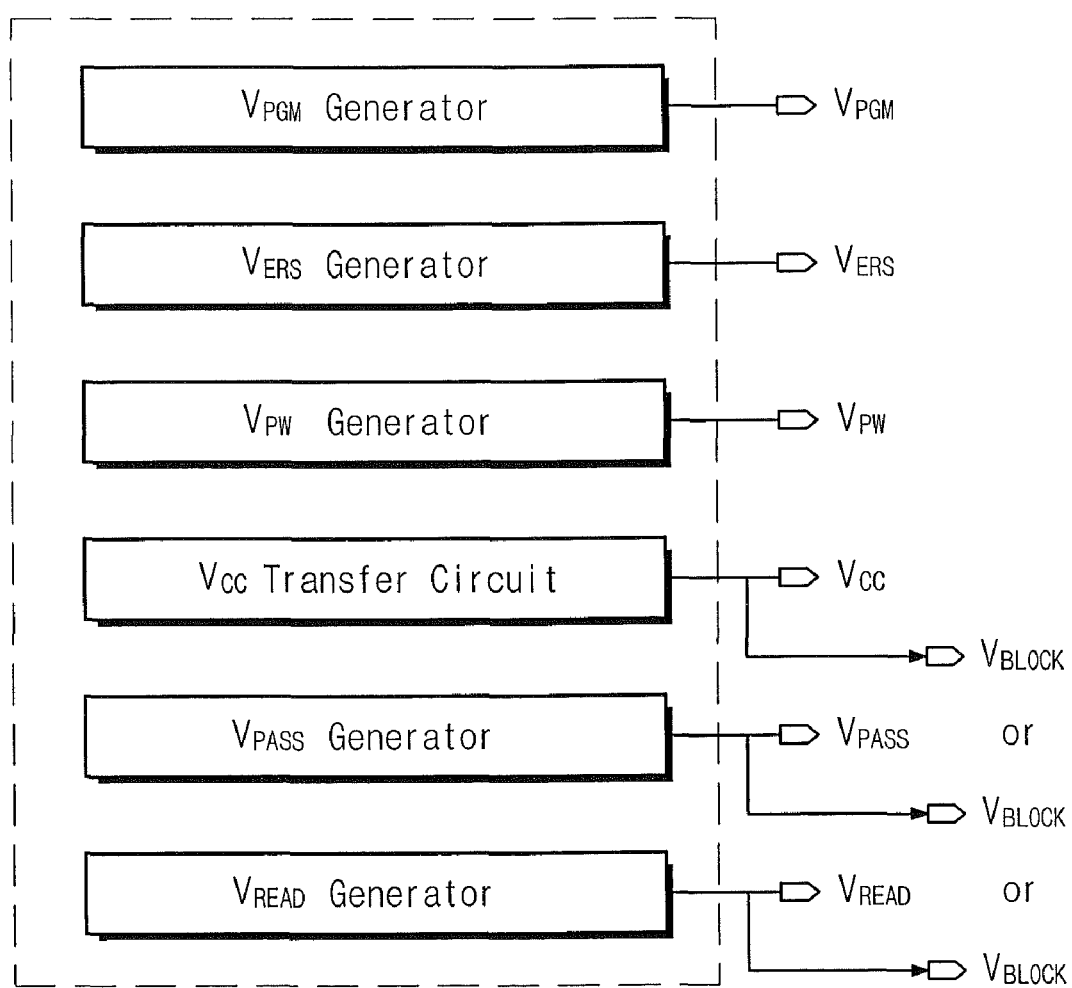
FIG. 6C is a block diagram that illustrates an embodiment of the voltage generator of FIG. 6A.

FIG. 6A illustrates a memory device 199 that is configured to perform the operations illustrated by FIGS. 3A-3C and 4A-4F, according to embodiments of the present invention. As illustrated, this memory device 199 includes a voltage generator 182, a word line decoder 181 and a CTF memory array within a pocket p-well (PW) region 190. This CTF memory array may be arranged to include a plurality of NAND-type strings of CTF memory cells that are electrically connected to respective bit lines $BL_0$-$BL_m$. A page buffer 183, bit line selection circuit 184 and a data buffer 185, which may be of conventional design, are also provided. The data buffer 185 is electrically coupled to an I/O data bus. A controller 180 is provided to control operation of the voltage generator 182, the word line decoder 181 and the data buffer 185, in response to a control signal(s) CNTL. As illustrated, the bit line selection circuit 184 is responsive to column selection signals Yi, which are generated by the word line decoder 181. The word line decoder 181 is responsive to an address (ADDR), which may include a row address used to select a designated word line and a column address used to specify the corresponding column selection signals Yi. As illustrated by FIG. 6B, the voltage generator 182 may be configured to generate a plurality of conventional voltage signals, such as a power supply voltage Vcc, a program voltage $V_{PGM}$, a pass voltage $V_{PASS}$, a read voltage $V_{READ}$, an erase voltage $V_{ERS}$ and a P-well voltage $V_{PW}$, and an additional block voltage $V_{BLOCK}$, which is used during the two-step erase operations described above with respect to FIGS. 3B-3C and 4A-4F. Alternatively, as illustrated by the voltage generator 182' FIG. 6C, the blocking voltage $V_{BLOCK}$ may be generated at a voltage equivalent to the power supply voltage $V_{CC}$, the pass voltage $V_{PASS}$ or the read voltage $V_{READ}$ and a separate blocking voltage generator may be omitted.

Figure 7A:
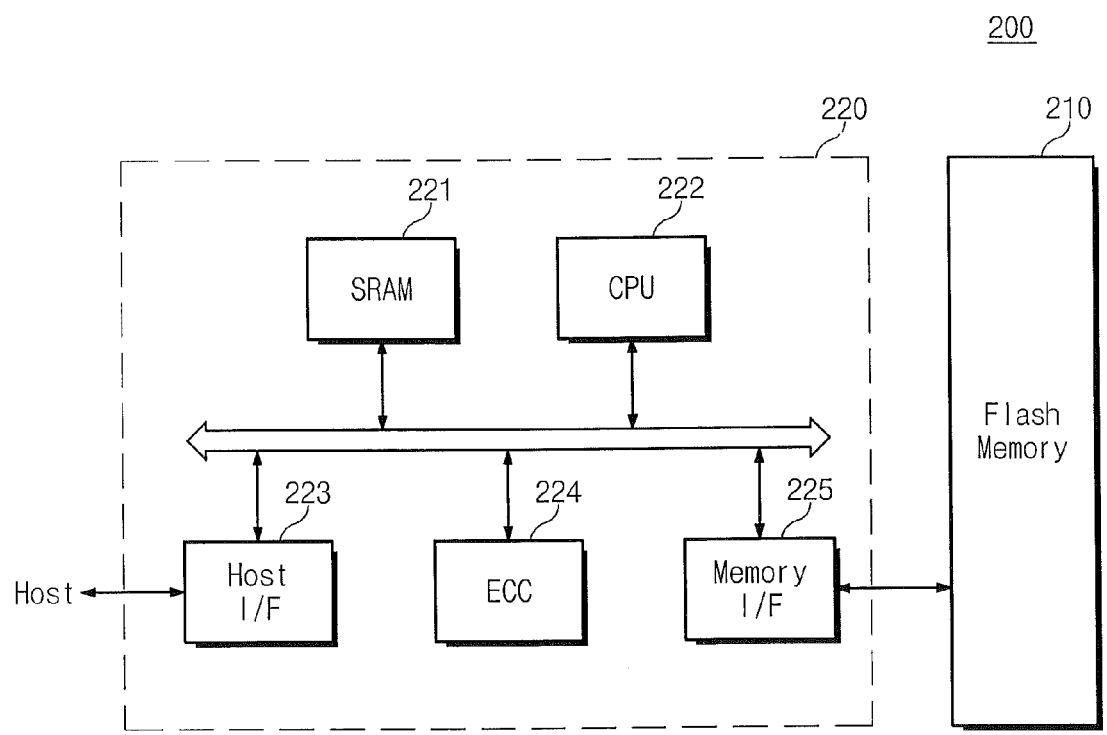
FIG. 7A is a block diagram of a memory card according to an embodiment of the present invention.
Figure 7B:
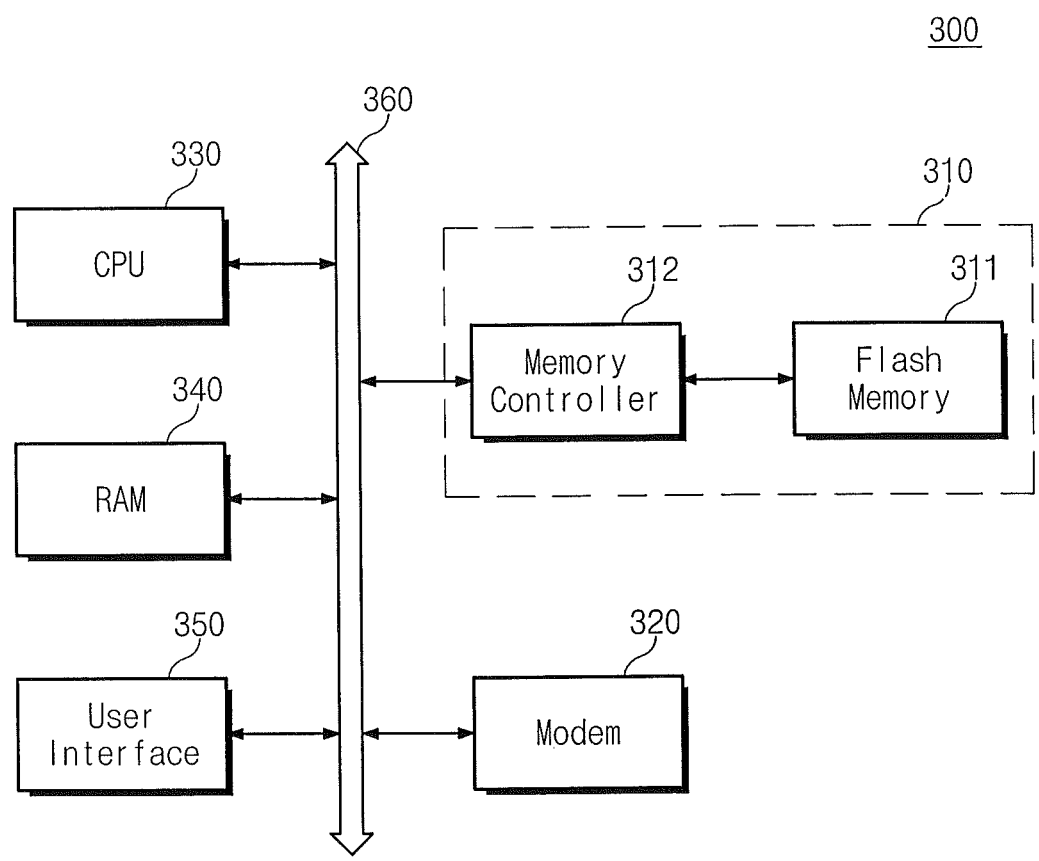
FIG. 7B is a block diagram of a memory system according to an embodiment of the present invention.

FIG. 7A illustrates an integrated circuit memory card 200 according to another embodiment of the present invention. This memory card 200 includes a memory controller 220 and a flash memory device 210, which may be configured to contain the elements of the memory device 199 of FIG. 6A. This flash memory device 210 is electrically coupled to a bidirectional bus, via a memory interface circuit 225, which may be of conventional design. Additional memory, such as an SRAM memory device 221, a processing unit (CPU) 222 and an error checking and correction circuit (ECC) 224 may also be electrically coupled to the bidirectional bus. Moreover, communications between the flash memory and a host processor (not shown) may be achieved using a host processor interface circuit 223. FIG. 7B illustrates an integrated circuit memory system 300 that includes a memory sub-system 310.

The memory sub-system 310 includes a flash memory device 311 and a memory controller 312, which electrically couples the flash memory device 310 to a bidirectional bus 360. This memory system 300 is further illustrated as including a central processing unit 330, a random access memory 340, a user interface 350 and a modem 320, which are electrically coupled to the bus 360.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of operating a nonvolatile memory device, comprising:
    erasing a first string of nonvolatile memory cells in the nonvolatile memory device by selectively erasing even-numbered nonvolatile memory cells in the first string and then selectively erasing odd-numbered nonvolatile memory cells in the first string, which are interleaved with the even-numbered of nonvolatile memory cells.

2. The method of claim 1, wherein said erasing the first string of nonvolatile memory cells comprises:
    erasing the even-numbered nonvolatile memory cells while simultaneously biasing the odd-numbered nonvolatile memory cells in a blocking condition that inhibits erasure of the odd-numbered nonvolatile memory cells; and
    erasing the odd-numbered nonvolatile memory cells while simultaneously biasing the even-numbered nonvolatile memory cells in a blocking condition that inhibits erasure of the even-numbered nonvolatile memory cells.

3. The method of claim 2, wherein the first string of nonvolatile memory cells is a NAND-type string.

4. The method of claim 3, wherein each of the nonvolatile memory cells in the first string is a charge-trap nonvolatile memory cell.

5. The method of claim 3, wherein the first string of nonvolatile memory cells comprises a charge storage layer.

6. The method of claim 2, wherein the first string of nonvolatile memory cells is disposed in a semiconductor well region of first conductivity type; and wherein erasing the even-numbered nonvolatile memory cells while simultaneously biasing the odd-numbered nonvolatile memory cells in a blocking condition comprises biasing the word lines associated with the even-numbered and odd-numbered nonvolatile memory cells at unequal voltages so that a voltage difference between the word lines associated with the even-numbered nonvolatile memory cells and the semiconductor well region is greater than a voltage difference between the word lines associated with the odd-numbered nonvolatile memory cells and the semiconductor well region.

* * * * *